(12) United States Patent
Mou et al.

(10) Patent No.: US 11,536,394 B2
(45) Date of Patent: Dec. 27, 2022

(54) MICRO FLUID ACTUATOR

(71) Applicant: Microjet Technology Co., Ltd., Hsinchu (TW)

(72) Inventors: Hao-Jan Mou, Hsinchu (TW); Rong-Ho Yu, Hsinchu (TW); Cheng-Ming Chang, Hsinchu (TW); Hsien-Chung Tai, Hsinchu (TW); Wen-Hsiung Liao, Hsinchu (TW); Chi-Feng Huang, Hsinchu (TW); Yung-Lung Han, Hsinchu (TW); Hsuan-Kai Chen, Hsinchu (TW)

(73) Assignee: MICROJET TECHNOLOGY CO., LTD., Hsinchu (TW)

( * ) Notice: Subject to any disclaimer, the term of this patent is extended or adjusted under 35 U.S.C. 154(b) by 655 days.

(21) Appl. No.: 16/661,060

(22) Filed: Oct. 23, 2019

(65) Prior Publication Data
US 2020/0166155 A1    May 28, 2020

(30) Foreign Application Priority Data

Nov. 23, 2018 (TW) .................................. 107141972

(51) Int. Cl.
*B81C 1/00* (2006.01)
*F16K 99/00* (2006.01)

(52) U.S. Cl.
CPC ...... *F16K 99/0048* (2013.01); *B81C 1/00031* (2013.01); *B81C 1/00166* (2013.01)

(58) Field of Classification Search
CPC ...................... B81C 1/00182; B81B 2201/036
See application file for complete search history.

(56) References Cited

U.S. PATENT DOCUMENTS

2013/0058819 A1*  3/2013  Kodama ............... F04B 43/043
                                                                 417/479

FOREIGN PATENT DOCUMENTS

| CN | 102308090 B | 12/2015 |
|----|-------------|---------|
| TW | 200413097 A | 8/2004  |
| TW | 200618100 A | 6/2006  |
| TW | 200918326 A | 5/2009  |
| TW | I635041 B   | 9/2018  |

* cited by examiner

*Primary Examiner* — Moazzam Hossain
(74) *Attorney, Agent, or Firm* — Birch, Stewart, Kolasch & Birch, LLP

(57) ABSTRACT

A micro fluid actuator includes an orifice layer, a flow channel layer, a substrate, a chamber layer, a vibration layer, a lower electrode layer, a piezoelectric actuation layer and an upper electrode layer, which are stacked sequentially. An outflow aperture, a plurality of first inflow apertures and a second inflow aperture are formed in the substrate by an etching process. A storage chamber is formed in the chamber layer by the etching process. An outflow opening and an inflow opening are formed in the orifice layer by the etching process. An outflow channel, an inflow channel and a plurality of columnar structures are formed in the flow channel layer by a lithography process. By providing driving power which have different phases to the upper electrode layer and the lower electrode layer, the vibration layer is driven to displace in a reciprocating manner, so as to achieve fluid transportation.

19 Claims, 14 Drawing Sheets

MICRO FLUID ACTUATOR

FIELD OF THE DISCLOSURE

The present disclosure relates to an actuator, and more particularly to a micro fluid actuator manufactured by microelectromechanical semiconductor thin film process.

BACKGROUND OF THE DISCLOSURE

Currently, in all fields, such as pharmaceutical industries, computer techniques, printing industries and energy industries, products are developed toward elaboration and miniaturization. The fluid transportation devices that are comprised in, for example, micro pumps, micro atomizers, print heads and industrial printing devices are important components.

With the rapid advance of technology, the application of the fluid transportation devices tends to be more and more diversified. For example, the industrial applications, the biomedical applications, the healthcare, the electronic cooling and so on, even the wearable devices, which are popular recently, the fluid transportation device are utilized therein. It is obviously that the conventional fluid transportation devices gradually tend to miniaturize the structure and maximize the flow rate thereof.

In the prior art, the miniaturized fluid transportation structure has been manufactured by micro-electromechanical system (MEMS) process. However, when the conventional micro fluid actuator is actuated, the displacement of the piezoelectric layer is too small so that the flow rate transmitted is insufficient. Therefore, how to utilize an innovative miniaturized fluid transportation structure to break through the bottleneck of the prior art has become an important part of development.

SUMMARY OF THE DISCLOSURE

The object of the present disclosure is to provide a micro fluid actuator manufactured by micro-electromechanical system process and capable of transporting fluid. The micro fluid actuator of the present disclosure is manufactured by semiconductor thin film process, therefore, the depth of a storage chamber of the micro fluid actuator can be designed to be very shallow, so as to increase the fluid compression ratio at the time of actuation and to compensate for the disadvantage that the displacement of the piezoelectric layer is too small.

In accordance with an aspect of the present disclosure, a micro fluid actuator is provided. The micro fluid actuator includes a substrate, a chamber layer, a vibration layer, a lower electrode layer, a piezoelectric actuation layer, an upper electrode layer, an orifice layer and a flow channel layer. The substrate has a first surface, a second surface, an outlet groove, an inlet groove, an outflow aperture, a plurality of first inflow apertures and a second inflow aperture. The outlet groove, the inlet groove, the outflow aperture, the plurality of first inflow apertures and the second inflow aperture are formed by an etching process. The outlet groove is in fluid communication with the outflow aperture, and the inlet groove is in fluid communication with the plurality of first inflow apertures and the second inflow aperture. The chamber layer is formed on the first surface of the substrate by a deposition process, and is etched to form a storage chamber. The storage chamber is in fluid communication with the outflow aperture, the plurality of first inflow apertures and the second inflow aperture. The vibration layer is formed on the chamber layer by the deposition process. The lower electrode layer is formed on the vibration layer by the deposition process and the etching process. The piezoelectric actuation layer is formed on the lower electrode layer by the deposition process and the etching process. The upper electrode layer is formed on the piezoelectric actuation layer by the deposition process and the etching process. The orifice layer has an outflow opening and an inflow opening formed by the etching process. The flow channel layer is formed on the orifice layer by a rolling process with a dry film material. An outflow channel, an inflow channel and a plurality of columnar structures are formed in the flow channel layer by a lithography process. The flow channel layer is mounted onto the second surface of the substrate by a flip-chip alignment process and a hot-pressing process. The outflow opening of the orifice layer is in fluid communication with the outlet groove of the substrate through the outflow channel, and the inflow opening of the orifice layer is in fluid communication with the inlet groove of the substrate through the inflow channel. Driving power which have different phases are provided to the upper electrode layer and the lower electrode layer, so as to drive and control the vibration layer to displace in a reciprocating manner, so that fluid is inhaled from the inflow opening, flows into the storage chamber through the plurality of first inflow apertures and the second inflow aperture, is compressed to flow through the outflow aperture and is then discharged out from the outflow opening to achieve fluid transportation.

The above contents of the present disclosure will become more readily apparent to those ordinarily skilled in the art after reviewing the following detailed description and accompanying drawings, in which:

DETAILED DESCRIPTION OF THE PREFERRED EMBODIMENT

The present disclosure will now be described more specifically with reference to the following embodiments. It is to be noted that the following descriptions of preferred embodiments of this disclosure are presented herein for purpose of illustration and description only. It is not intended to be exhaustive or to be limited to the precise form disclosed.

Figure 1:
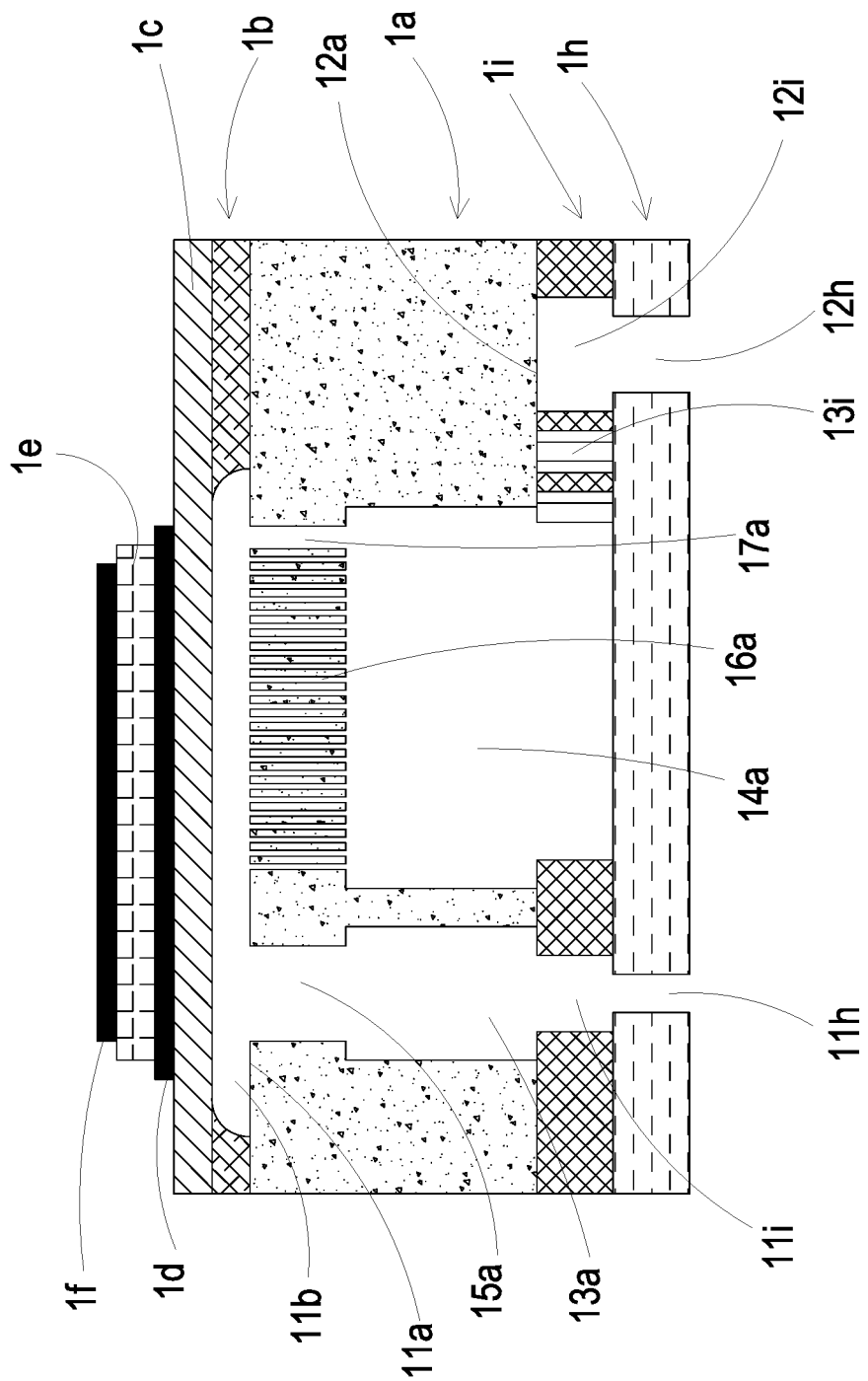
FIG. 1 is a cross sectional view illustrating a micro fluid actuator according to an embodiment of the present disclosure.

Please refer to FIG. 1, the present disclosure provides a micro fluid actuator 100, which includes at least one substrate 1b, at least one chamber layer 1b, at least one vibration layer 1c, at least one lower electrode layer 1d, at least one piezoelectric actuation layer 1e, at least one upper electrode layer 1f, at least one orifice layer 1h and at least one flow channel layer 1i. The numbers of the substrate 1a, the chamber layer 1b, the vibration layer 1c, the lower electrode layer 1d, the piezoelectric actuation layer 1e, the upper electrode layer 1f, the orifice layer 1h and the flow channel layer 1i are exemplified by one for each respectively in the following embodiments, but not limited thereto. It is noted that, each of the substrate 1a, the chamber layer 1b, the vibration layer 1c, the lower electrode layer 1d, the piezoelectric actuation layer 1e, the upper electrode layer 1f, the orifice layer 1h and the flow channel layer 1i can also be provided in plural numbers.

The micro fluid actuator 100 of the present disclosure is used to transport fluid. Please refer to FIG. 1, in some embodiments, the micro fluid actuator 100 includes a substrate 1b, a chamber layer 1b, a vibration layer 1c, a lower electrode layer 1d, a piezoelectric actuation layer 1e, an upper electrode layer 1f, an orifice layer 1h and a flow channel layer 1i. The flow channel layer 1i, the orifice layer 1h, the substrate 1b, the chamber layer 1b, the vibration layer 1c, the lower electrode layer 1d, the piezoelectric actuation layer 1e and the upper electrode layer 1f are stacked sequentially and formed into one piece. The detail structure is described as follows.

Figure 2A:
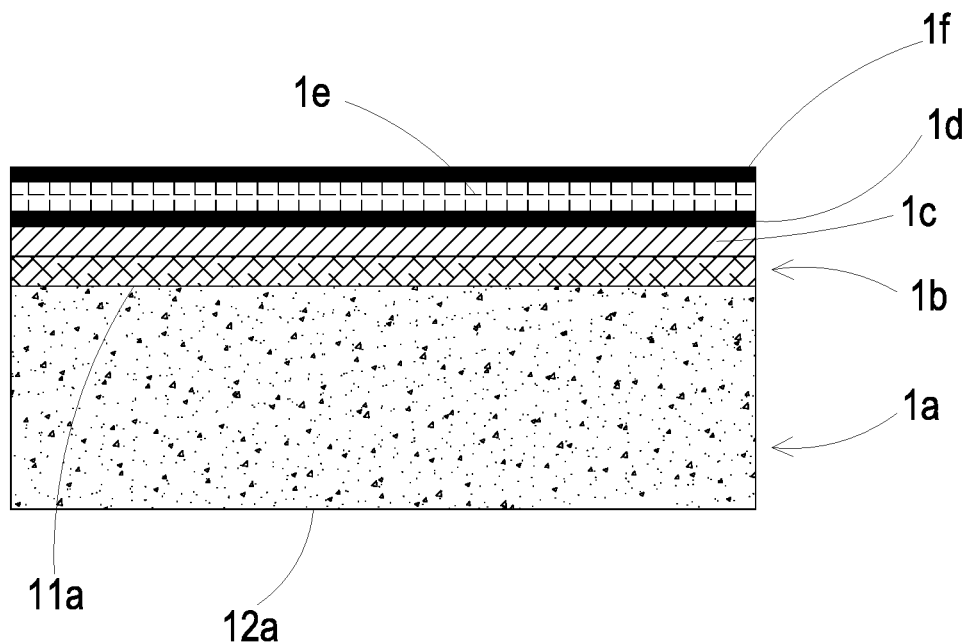
FIGS. 2A to 2K are cross sectional views illustrating a manufacturing process of the micro fluid actuator according to the embodiment of the present disclosure.

Please refer to FIG. 2A, in some embodiments, the substrate 1a is made of silicon material. The substrate 1a has a first surface 11a and a second surface 12a. The first surface 11a and the second surface 12a are opposite to each other. In some embodiments, the chamber layer 1b is formed on the first surface 11a of the substrate 1a by a deposition process with a silicon dioxide material. In some embodiments, the deposition process is at least one selected from the group consisting of physical vapor deposition (PVD), chemical vapor deposition (CVD) and a combination thereof, but the present disclosure is not limited thereto. In some embodiments, the vibration layer 1c is formed on the chamber layer 1b by the deposition process with a silicon nitride material. In some embodiments, the lower electrode layer 1d is formed on the chamber layer 1c by the deposition process with a metallic material. Preferably but not exclusively, the lower electrode layer 1d is made of platinum material or titanium material. In some embodiments, the piezoelectric actuation layer 1e is formed on the lower electrode layer 1d by the deposition process with a piezoelectric material. In some embodiments, the upper electrode layer 1f is formed on the piezoelectric actuation layer 1e by the deposition process with a metallic material. Preferably but not exclusively, the upper electrode layer 1f is made of gold material or aluminum material. It is noted that, the structure shown in FIG. 2A is a structure that can be fabricated by the existing foundry technology, and it is the advantage of low cost.

Figure 2B:
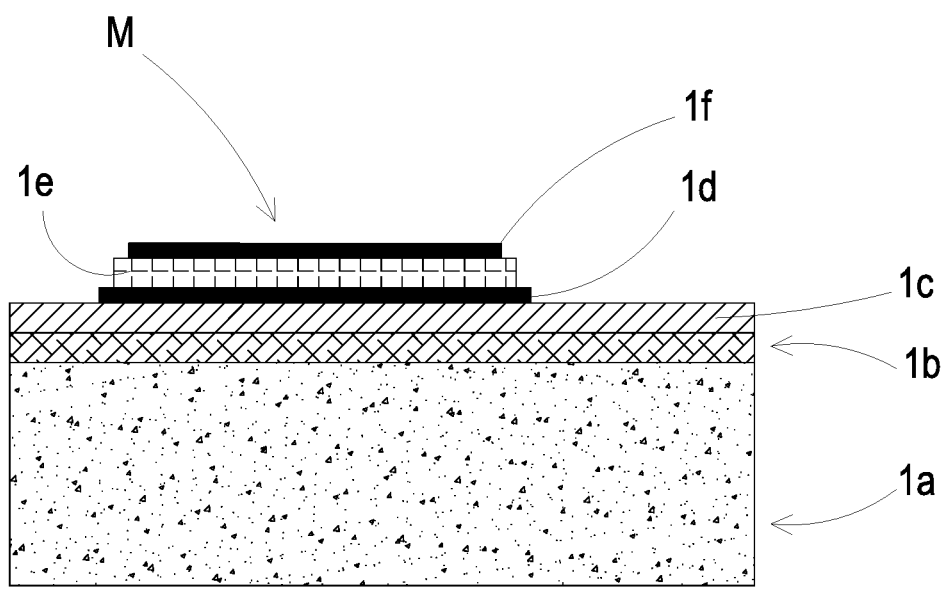

Please refer to FIG. 2B, in some embodiments, the lower electrode layer 1d, the piezoelectric actuation layer 1e and the upper electrode layer 1f are etched to define an active region M by a lithography process and an etching process. It is noted that, in some embodiments, the etching process is at least one selected from the group consisting of wet etching, dry etching and a combination thereof, but the present disclosure is not limited thereto.

Figure 2C:
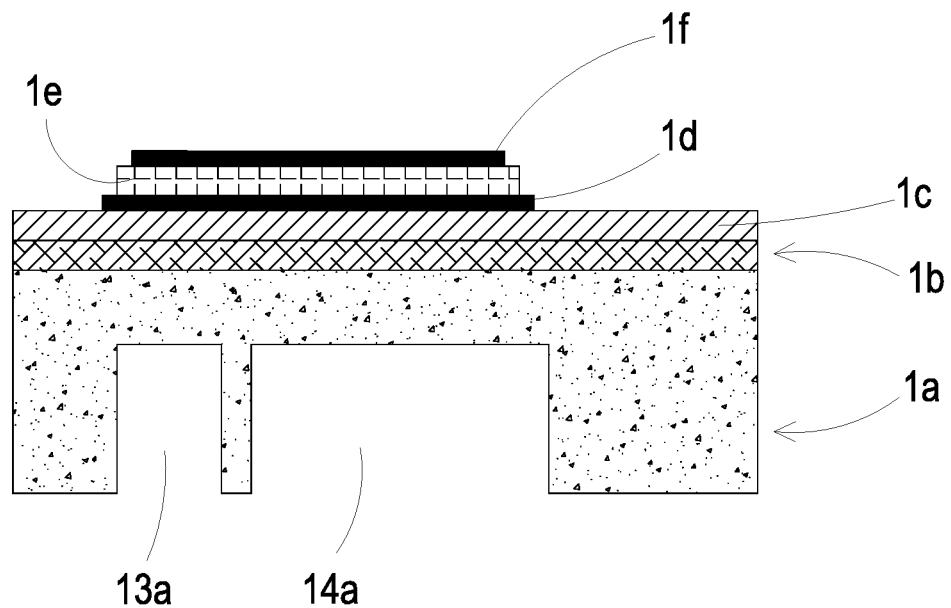

Please refer to FIG. 2C, in some embodiments, an outlet groove 13a and an inlet groove 14a are formed on the second surface 12a of the substrate 1a by a dry etching process. The outlet groove 13a and the inlet groove 14a have the same etching depth, and the etching depth is ranged between the first surface 11a and the second surface 12a but not in contact with the chamber layer 1b.

Figure 2D:
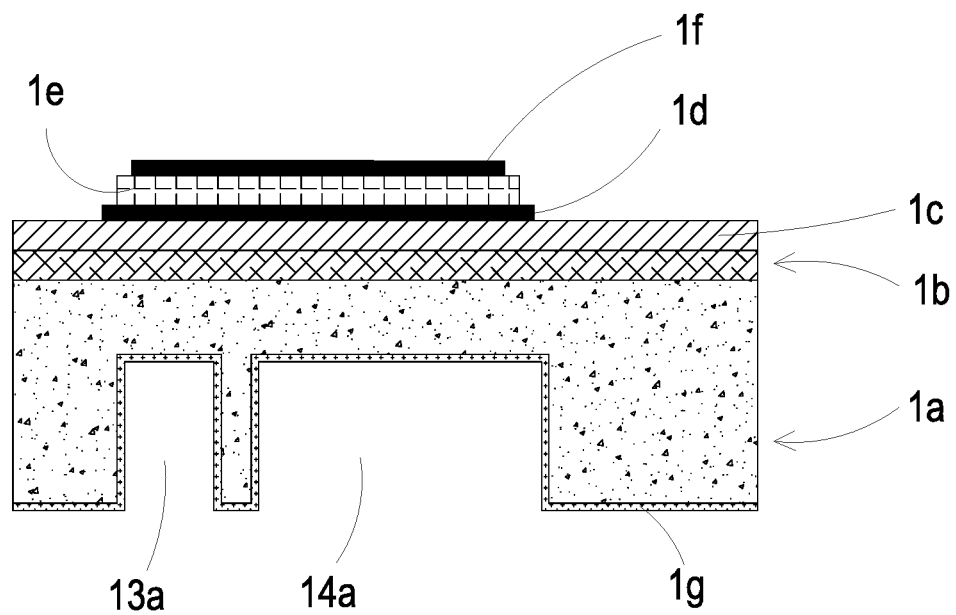
Figure 2E:
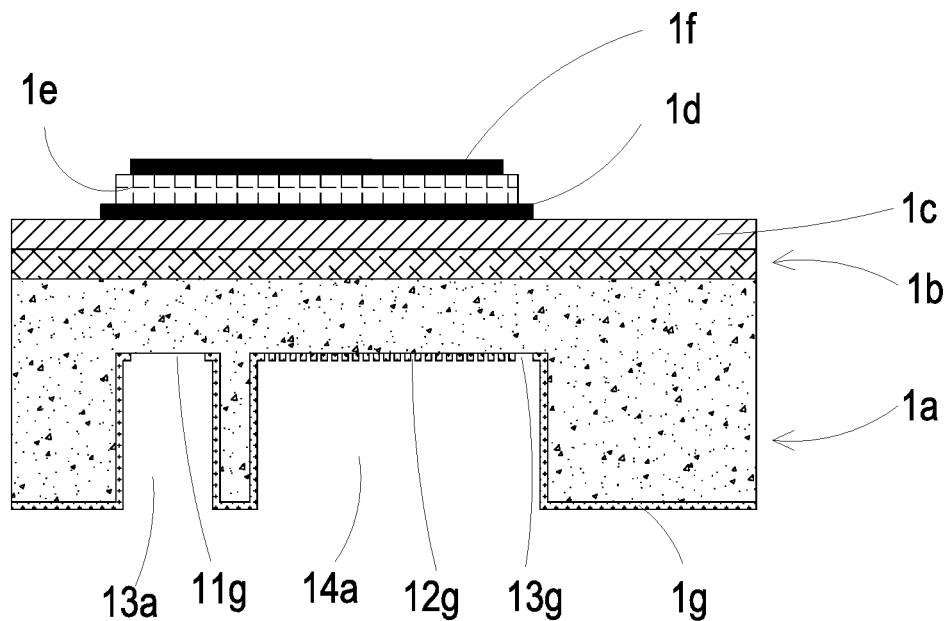

Please refer to FIGS. 2D and 2E, in some embodiments, a mask layer 1g is formed on the second surface 12a and within the outlet groove 13a and the inlet groove 14a of the substrate 1a by the deposition process with the silicon dioxide material. Moreover, by performing a precision perforation process on the mask layer 1g, a first flow perforation 11g is formed within the outlet groove 13a, and a plurality of second flow perforations 12g and a third flow perforation 13g are formed within the inlet groove 14a. In some embodiments, a diameter of the first flow perforation 11g is greater than a diameter of the third flow perforation 13g, and the diameter of the third flow perforation 13g is greater than a diameter of each of the second flow perforations 12g, but the present disclosure is not limited thereto. The first flow perforation 11g, the plurality of second flow perforations 12g and the third flow perforation 13g are perforated until in contact with the substrate 1a, so as to expose the substrate 1a. Preferably but not exclusively, in some embodiments, the precision perforation process is an excimer laser machining process.

Figure 2F:
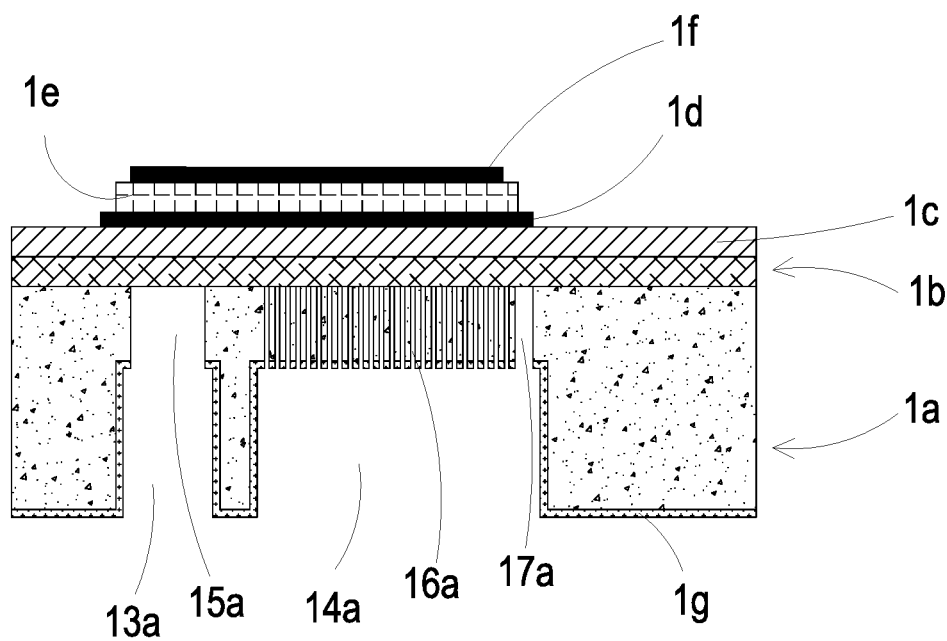
Figure 3:
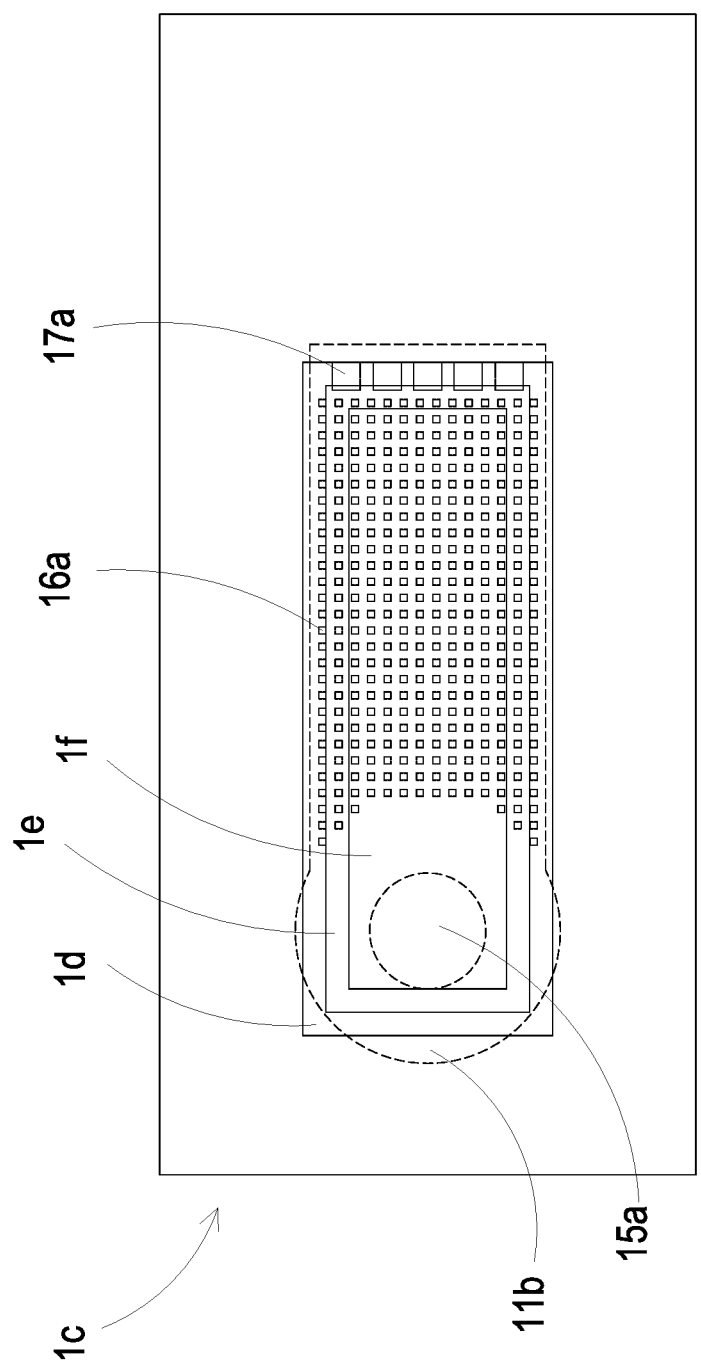
FIG. 3 is a top schematic view illustrating the micro fluid actuator according to the embodiment of the present disclosure.
Figure 5A:
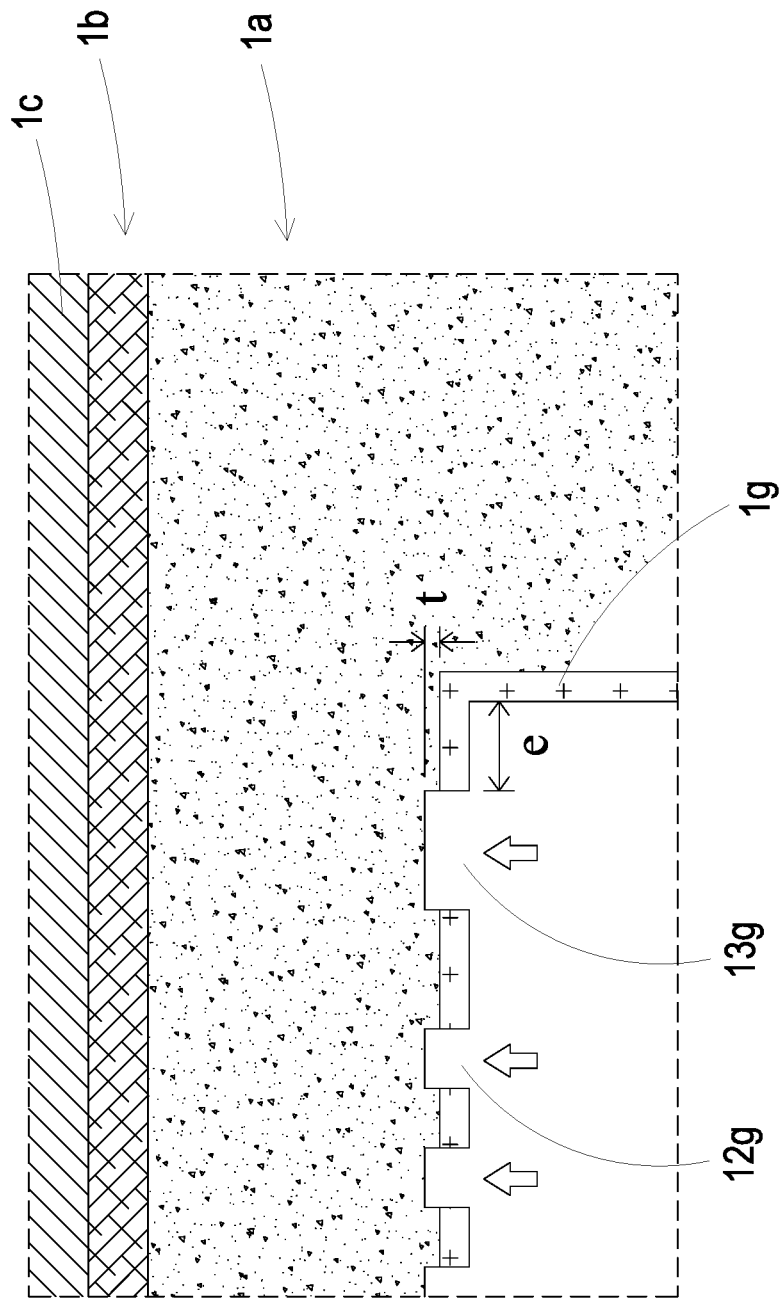
FIGS. 5A to 5C are cross sectional views illustrating an etching process of an inlet aperture of the micro fluid actuator according to the embodiment of the present disclosure.
Figure 5B:
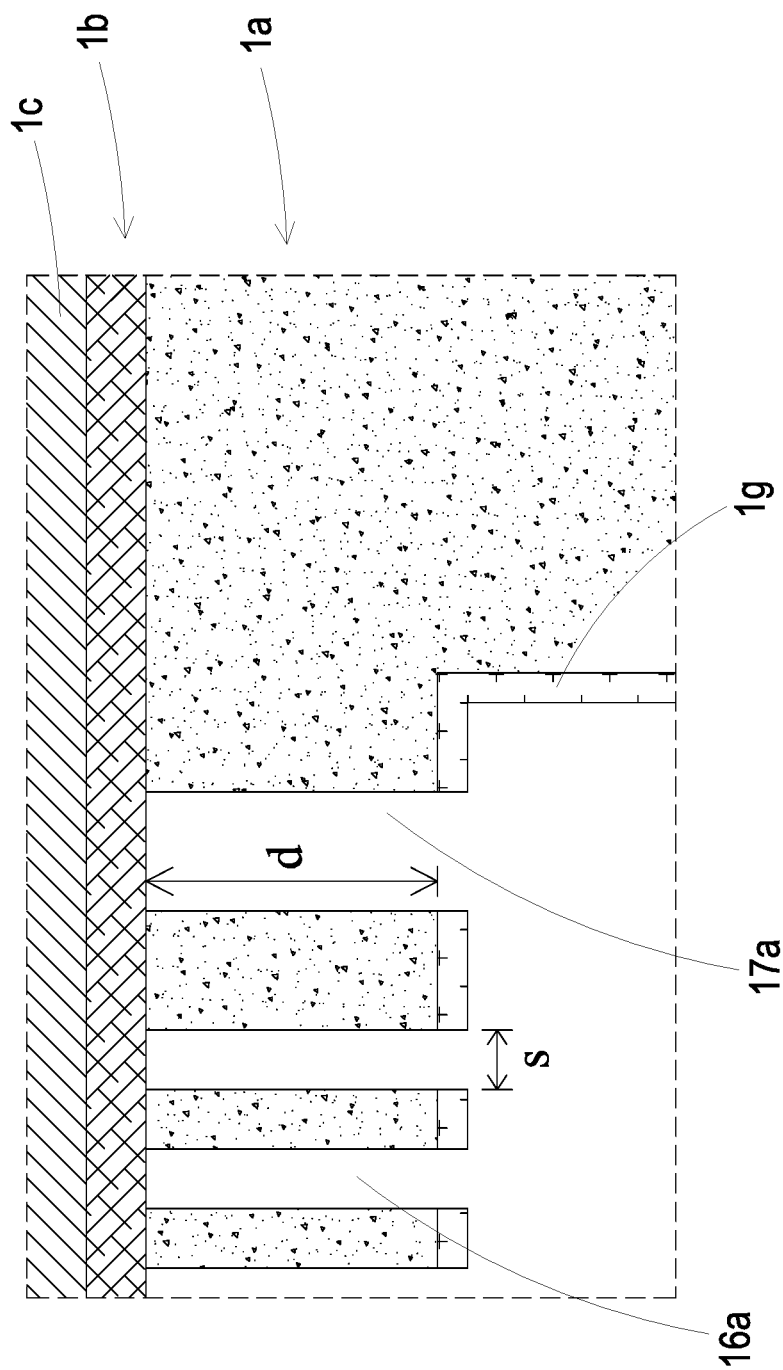

Pease refer to FIG. 2F and FIG. 3, in some embodiments, by performing a low-temperature deep etching process on the substrate 1b, a part of the substrate 1a aligned with the first flow perforation 11g, the plurality of second flow perforations 12g and the third flow perforation 13g is etched, so as to form an outflow aperture 15a, a plurality of first inflow apertures 16a and a second inflow aperture 17a of the substrate 1a. The outflow aperture 15a is etched along the first flow perforation 11g and is etched until in contact with the chamber layer 1b. The plurality of first inflow apertures 16a are respectively etched along the plurality of second flow perforations 12g and are etched until in contact with chamber layer 1b. The second inflow aperture 17a is etched along the third flow perforation 13g and is etched until in contact with chamber layer 1b. Preferably but not exclusively, in some embodiments, the low-temperature deep etching process is a Bosch deep reactive-ion etching (Bosch DRIE) process. Please refer to FIG. 2E and FIG. 5A, in some embodiments, when the excimer laser machining process is performed on the mask layer 1g to form the first flow perforation 11g, the plurality of second flow perforations 12g and the third flow perforation 13g, the lateral walls of the outlet groove 13a and the inlet groove 14a are reserved with a buffer distance e, so as to avoid the deviation of the perforation position or the perforation angle. In addition, since the Bosch deep reactive-ion etching (Bosch DRIE) process is utilized to merely etch the silicon material of the substrate 1a and an over-etch depth t is therefore reserved on the substrate 1a by utilizing the excimer laser machining process. In such a manner, it is advantageous for the substrate 1a to be accurately and easily etched through the over-etch depth t to form the first outflow aperture 15a, the plurality of first inflow apertures 16a and the second inflow aperture 17a. In some embodiments, a minimum diameter of the outflow aperture 15a, each of the plurality of first inlet apertures 16a and the second inlet aperture 17a is ranged from 5 micrometers (μm) to 50 micrometers (μm), and diameters of the outflow aperture 15a, the plurality of first inlet apertures 16a and the second inlet aperture 17a are adjustable according to the properties of the fluid. Following, please refer to FIGS. 2F and 5B, the outflow aperture 15a, each of the plurality of first inflow apertures 16a and the second inflow aperture 17a have an aperture depth d and an aperture diameter s. Preferably but not exclusively, an aspect ratio d/s is ranged up to 40. By considering the appropriate aspect ratio d/s of the apertures in the machining process, it benefits to prevent the polarity distribution of the back-end piezoelectric material from being influenced by the high temperature generated from the machining process, and it avoids causing a depolarization reaction.

Figure 2G:
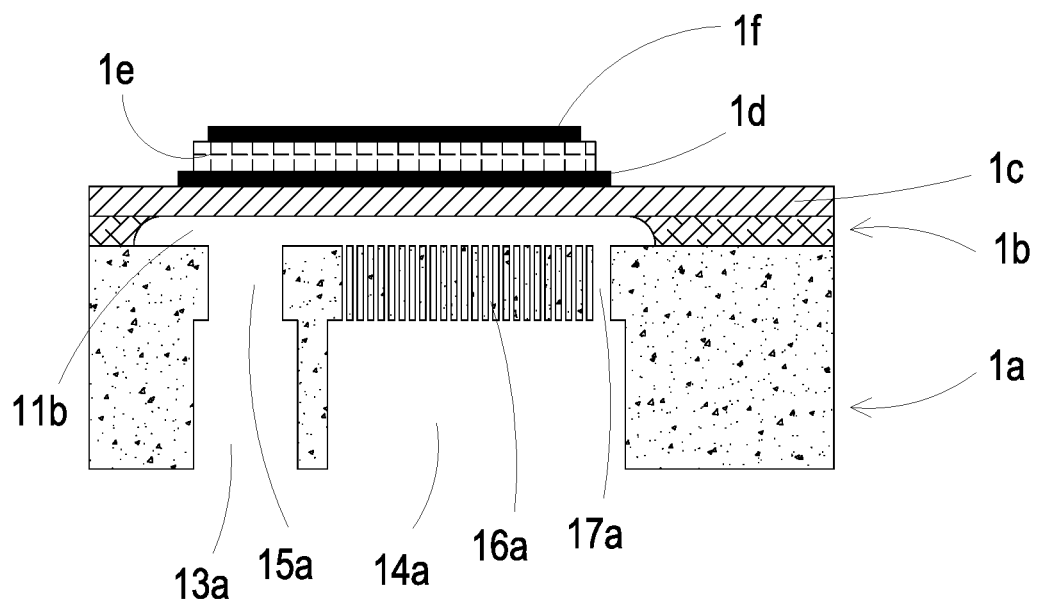
Figure 5C:
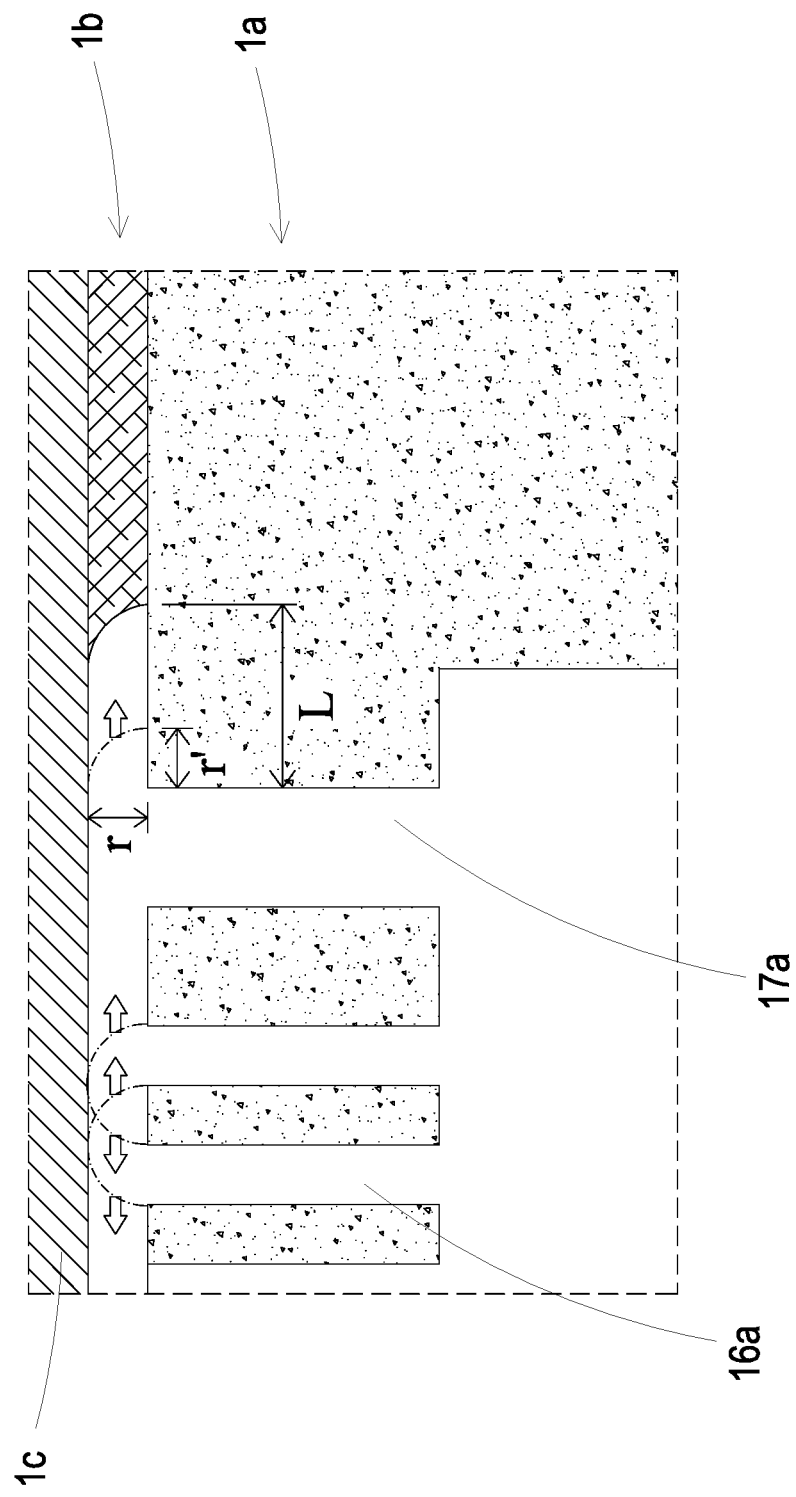

Please refer to FIG. 2G, in some embodiments, a wet etching process is further performed on the chamber layer 1b to form a storage chamber 11b therein. Namely, the etching liquid enters from the first flow perforation 11g, the plurality of second flow perforations 12g and the third flow perforation 13g, and flows into the chamber layer 1b through the outflow aperture 15a, the plurality of first inflow apertures 16a and the second inflow aperture 17a, so that a part of the chamber layer 1b is removed and released by the etching liquid so as to define the storage chamber 11b. Thus, the storage chamber 11b is in fluid communication with the outflow aperture 15a, the plurality of first inflow apertures 16a and the second inflow aperture 17a. In some embodiments, the hydrofluoric acid (HF) etching liquid is utilized in the wet etching process to etch the chamber layer 1b, but the present disclosure is not limited thereto. Preferable but not exclusively, a thickness of the chamber layer 1b is ranged from 1 micrometer ($\mu$m) to 5 micrometers ($\mu$m). It is noted that, when the storage chamber 11b is formed by the wet etching process, the mask layer 1g is removed as well. After the storage chamber 11b is formed and the mask layer 1g is removed, the outlet groove 13a and the outflow aperture 15a of the substrate 1a are in fluid communication with each other, and the inlet groove 14a of the substrate 1a is in fluid communication with the plurality of first inflow apertures 16a and the second inflow aperture 17a thereof. Please further refer to FIG. 2G and FIG. 5C, preferably but not exclusively, in some embodiments, the wet etching process is usually an isotropic etching. In some embodiments, when the storage chamber 11b is formed by the wet etching process, the storage chamber 11b has a chamber depth r, which is equal to the thickness of chamber layer 1b. Moreover, a side etching distance r' is generated by the wet etching process as well, and the chamber depth r is equal to the side etching distance r'. Therefore, the wet etching process in some embodiments is the isotropic etching. In addition, since the diameters of the outflow aperture 15a, each of the plurality of first inflow apertures 16a and the second inflow aperture 17a are ranged from 5 micrometers ($\mu$m) to 50 micrometers ($\mu$m), respectively, and the chamber depth r is ranged from 1 micrometer ($\mu$m) to 5 micrometers ($\mu$m). an over-etching process is required to be performed to etch the storage chamber 11b, a lengthened etching time is needed to completely remove the remaining unetched material. In some embodiments, when the wet etching process is performed to form the storage chamber 11b, an over-etching distance L is generated. The over-etching distance L is greater than the side etching distance r', so that the silicon dioxide material within the storage chamber 11b can be completely removed.

Figure 2H:
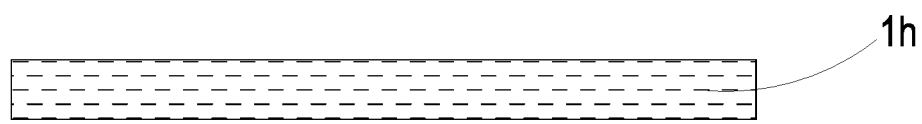
Figure 2I:
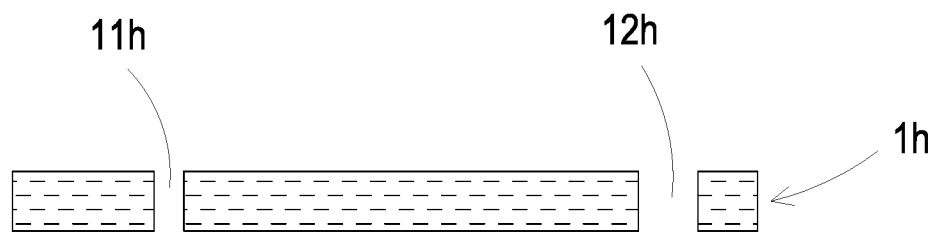

Please refer to FIGS. 2H and 2I, in some embodiments, the orifice layer 1h is provided, and an outflow opening 11h and an inflow opening 12h are formed by the etching process. In some embodiments, the etching process performed on the orifice layer 1h is at least one selected from the group consisting of wet etching, dry etching and a combination thereof, but the present disclosure is not limited thereto. Preferably but not exclusively, the orifice layer 1h is made of stainless steel material or glass material.

Figure 2J:
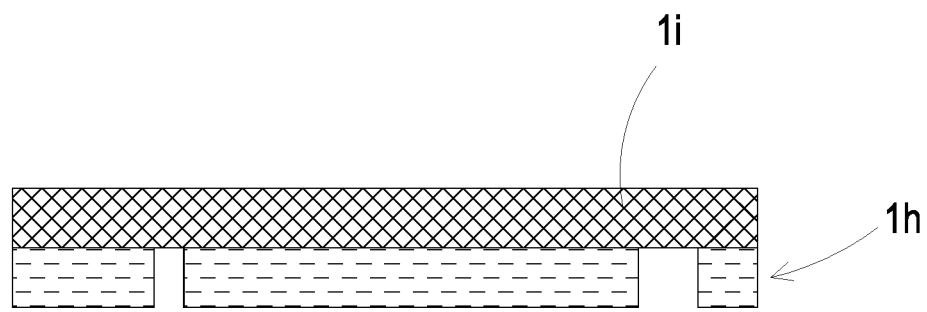
Figure 2K:
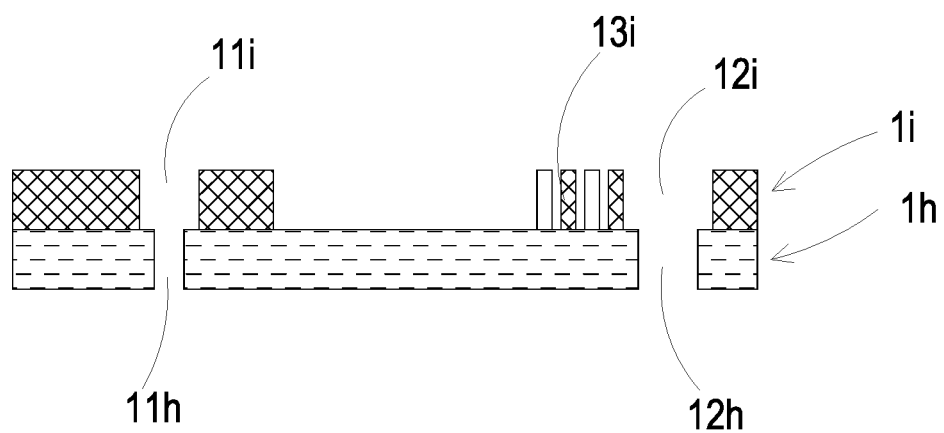
Figure 4:
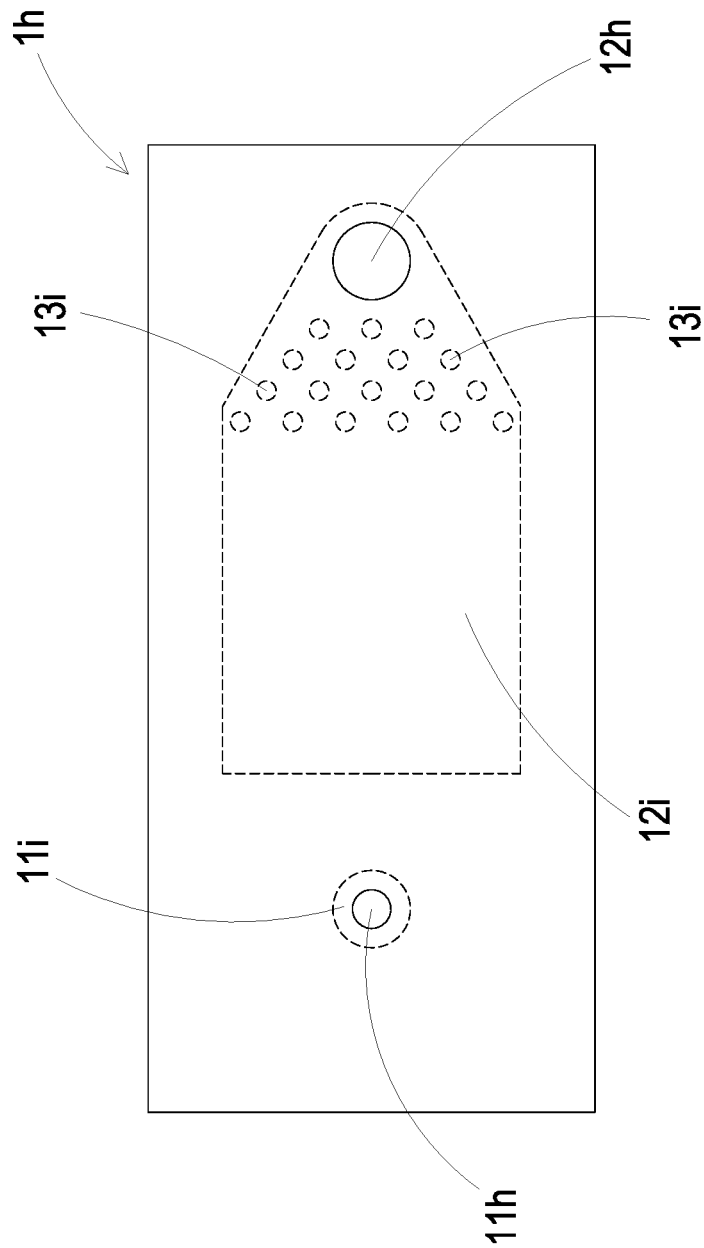
FIG. 4 is a bottom schematic view illustrating the micro fluid actuator according to the embodiment of the present disclosure.

Please refer to FIGS. 2J and 2K and FIG. 4, in some embodiments, the flow channel layer 1i is formed on the orifice layer 1h by a rolling process with a dry film material. Moreover, an outflow channel 11i, an inflow channel 12i and a plurality of columnar structures 13i are formed in the flow channel layer 1i by a lithography process. In some embodiments, the outflow channel 11i is in fluid communication with the outflow opening 11h of the orifice layer 1h. The inflow channel 12i is in fluid communication with the inflow opening 12h of the orifice layer 1h. In some embodiments, the plurality of the columnar structures 13i are staggeredly formed in the inflow channel 12i (as shown in FIG. 4), so as to filter the impurities in the fluid. Preferably but not exclusively, in some embodiments, the dry film material is a photosensitive polymer dry film.

Please refer back to FIG. 1, the flow channel layer 1i is mounted onto the second surface 12a of the substrate 1a by a flip-chip alignment process and a hot-pressing process, so as to form the micro fluid actuator 100 of the present disclosure. Thus, the outflow opening 11h of the orifice layer 1h is in fluid communication with the outlet groove 13a of the substrate 1a through the outflow channel 11i of the flow channel layer 1i, and the inflow opening 12h of the orifice layer 1h is in fluid communication with the inlet groove 14a of the substrate 1a through the inflow channel 12i of the flow channel layer 1i.

Figure 6A:
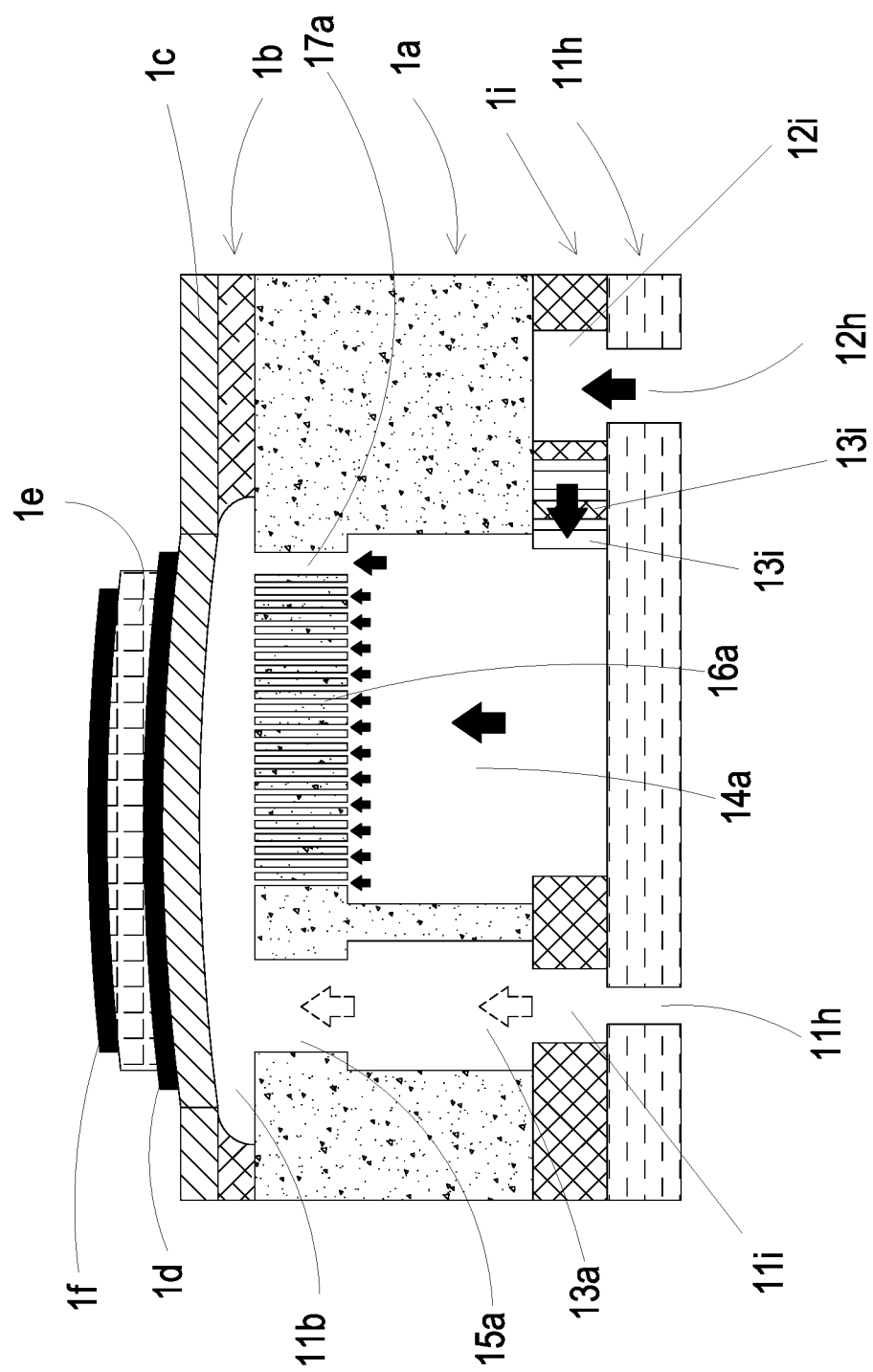
FIGS. 6A to 6B are cross sectional views illustrating actuations of the micro fluid actuator of the present disclosure.
Figure 6B:
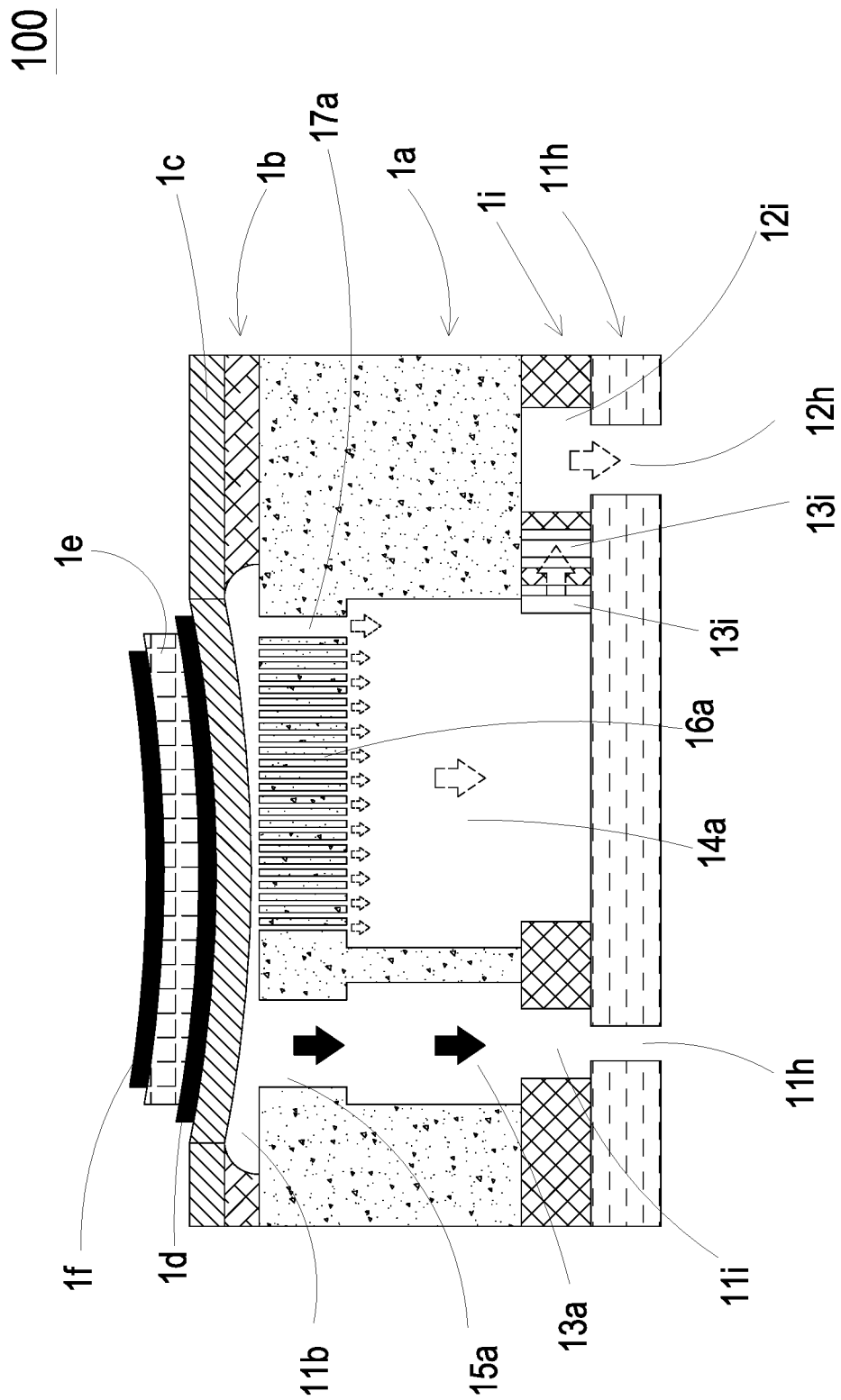

Please refer to FIGS. 6A and 6B, in some embodiments, the specific operation of the micro fluid actuator 100 is to provide driving power which have opposite phases to the upper electrode layer 1f and the lower electrode layer 1d, so as to drive and control the vibration layer 1c to displace in a reciprocating manner. As shown in FIG. 6A, when a positive voltage is applied to the upper electrode layer 1f and a negative voltage is applied to the lower electrode layer 1d, the piezoelectric actuation layer 1e drives the vibration layer 1c to displace in a direction away from the substrate 1a. Thus, the fluid is inhaled from the exterior into the micro fluid actuator 100 through the inflow opening 12h, and the fluid inhaled into the micro fluid actuator 100 flows through the inflow channel 12i of the flow channel layer 1i, the inlet groove 14a of the substrate 1a, and the plurality of first inflow apertures 16a and the second aperture 17a of the substrate 1a sequentially. Then, the fluid is converged into the storage chamber 11b of the chamber layer 1b. As shown in FIG. 6B, subsequently, electrical properties of the upper electrode layer 1f and the lower electrode layer 1d are changed. Namely, the negative voltage is applied to the upper electrode layer 1f and the positive voltage is applied to the lower electrode layer 1d, so that the piezoelectric actuation layer 1d drives and controls the vibration layer 1c to displace in a direction toward the substrate 1a. Thus, the volume of the storage chamber 11b is compressed by the vibration layer 1c, and cause the fluid converged in the storage chamber 11b to flow through the outflow aperture 15a of the substrate 1b, the outlet groove 13a of the substrate 1a and the outflow channel 11i of the flow channel layer 1i sequentially, and to be discharged out of the micro fluid actuator 100 from the outflow opening 11h of the orifice layer 1h to achieve fluid transportation.

It is noted that, when the micro fluid actuator 100 is actuated to inhale the fluid from the exterior, a portion of the fluid may be inhaled into the micro fluid actuator 100 through the outflow opening 11h of the orifice layer 1h. However, since the position of the outflow aperture 15a of the substrate 1a corresponding to the piezoelectric actuator layer 1c is not the region where the largest displacement takes place, the amount of the fluid inhaled from the exterior through the outlet opening 11h is relatively small. When the fluid is discharged out of the micro fluid actuator 100, the plurality of columnar structures 13i of the flow channel layer 1i provide a damping effect on the reflowed fluid. In addition, the position of the second inflow aperture 17a of the substrate 1a corresponds to an edge of the piezoelectric actuation layer 1c where the smallest displacement takes place. Therefore, the amount of the fluid discharged out from the inlet opening 12h is relatively small.

Moreover, it should be noted that, the problem that the flowing resistance of the plurality of first inflow apertures 16a of the substrate 1a is excessively large can be improved by adjusting the waveform of the driving power and prolonging the actuation time of the micro fluid actuator 100 for inhaling the fluid from the exterior.

In summary, the present disclosure provides a micro fluid actuator. The micro fluid actuator is mainly manufactured by a micro-electromechanical system (MEMS) semiconductor process. By providing driving power which have different phases to the upper electrode layer and the lower electrode layer, the vibration layer is driven to displace in a reciprocating manner, so as to achieve fluid transportation. In this way, the micro fluid actuator can increase the fluid compression ratio during operation to compensate for disadvantage of that the displacement of the piezoelectric layer is too small. It facilitates to achieve the feasibility of the fluid transportation and the great transporting efficiency in an extremely miniaturized structure. It is extremely valuable for the use of the industry, and it is submitted in accordance with the law.

While the disclosure has been described in terms of what is presently considered to be the most practical and preferred embodiments, it is to be understood that the disclosure needs not be limited to the disclosed embodiments. On the contrary, it is intended to cover various modifications and similar arrangements included within the spirit and scope of the appended claims which are to be accorded with the broadest interpretation so as to encompass all such modifications and similar structures.

What is claimed is:

1. A micro fluid actuator comprising:
a substrate having a first surface, a second surface, an outlet groove, an inlet groove, an outflow aperture, a plurality of first inflow apertures and a second inflow aperture, wherein the outlet groove, the inlet groove, the outflow aperture, the plurality of first inflow apertures and the second inflow aperture are formed by an etching process, the outlet groove is in fluid communication with the outflow aperture, and the inlet groove is in fluid communication with the plurality of first inflow apertures and the second inflow aperture;
a chamber layer formed on the first surface of the substrate by a deposition process, and etched to form a storage chamber, wherein the storage chamber is in fluid communication with the outflow aperture, the plurality of first inflow apertures and the second inflow aperture;
a vibration layer formed on the chamber layer by the deposition process;
a lower electrode layer formed on the vibration layer by the deposition process and the etching process;
a piezoelectric actuation layer formed on the lower electrode layer by the deposition process and the etching process;
an upper electrode layer formed on the piezoelectric actuation layer by the deposition process and the etching process;
an orifice layer having an outflow opening and an inflow opening formed by the etching process; and
a flow channel layer formed on the orifice layer by a rolling process with a dry film material, wherein an outflow channel, an inflow channel and a plurality of columnar structures are formed in the flow channel layer by a lithography process, wherein the flow channel layer is mounted onto the second surface of the substrate by a flip-chip alignment process and a hot-pressing process, wherein the outflow opening of the orifice layer is in fluid communication with the outlet groove of the substrate through the outflow channel, and wherein the inflow opening of the orifice layer is in fluid communication with the inlet groove of the substrate through the inflow channel;
wherein driving power which have different phases are provided to the upper electrode layer and the lower electrode layer so as to drive and control the vibration layer to displace in a reciprocating manner, so that fluid is inhaled from the inflow opening, flows into the storage chamber through the plurality of first inflow apertures and the second inflow aperture, is compressed to flow through the outflow aperture and is then discharged out from the outflow opening to achieve fluid transportation.

2. The micro fluid actuator according to claim 1, wherein after the fluid is inhaled from the inflow opening, the fluid flows through the inflow channel, the inlet groove, the plurality of first inflow apertures and the second inflow aperture sequentially and enters into the storage chamber.

3. The micro fluid actuator according to claim 1, wherein after the storage chamber is compressed, the fluid contained in the storage chamber flows through the outflow aperture, the outlet groove and the outflow channel sequentially and is discharged out from the outflow opening.

4. The micro fluid actuator according to claim 1, wherein the plurality of columnar structures are formed within the inflow channel.

5. The micro fluid actuator according to claim 1, wherein the substrate is made of silicon material.

6. The micro fluid actuator according to claim 1, wherein the chamber layer is made of silicon dioxide material.

7. The micro fluid actuator according to claim 1, wherein the lower electrode layer is made of platinum material.

8. The micro fluid actuator according to claim 1, wherein the lower electrode layer is made of titanium material.

9. The micro fluid actuator according to claim 1, wherein the upper electrode layer is made of gold material.

10. The micro fluid actuator according to claim 1, wherein the upper electrode layer is made of aluminum material.

11. The micro fluid actuator according to claim 1, wherein the outflow aperture, the plurality of first inflow apertures and the second inflow aperture of the substrate are formed by a deep reactive ion etching process.

12. The micro fluid actuator according to claim 1, wherein the storage chamber of the chamber layer is formed by a hydrofluoric acid wet etching process.

13. The micro fluid actuator according to claim 1, wherein the orifice layer is made of stainless steel material.

14. The micro fluid actuator according to claim 1, wherein the orifice layer is made of glass material.

15. The micro fluid actuator according to claim 1, wherein the dry film material of the flow channel layer is a photosensitive polymer dry film.

16. The micro fluid actuator according to claim 1, wherein when a positive voltage is applied to the upper electrode layer and a negative voltage is applied to the lower electrode layer, the piezoelectric actuation layer drives the vibration layer to displace in a direction away from the substrate.

17. The micro fluid actuator according to claim 1, wherein when a negative voltage is applied to the upper electrode layer and a positive voltage is applied to the lower electrode layer, the piezoelectric actuation layer drives the vibration layer to displace in a direction toward the substrate.

18. The micro fluid actuator according to claim 1, wherein:
- applying a positive voltage to the upper electrode layer and a negative voltage to the lower electrode layer, the piezoelectric actuation layer then drives and controls the vibration layer to displace in a direction away from the substrate, so that fluid is inhaled from the exterior into the micro fluid actuator through the inflow opening, flows through the inflow channel, the inlet groove, the plurality of first inflow apertures and the second aperture sequentially, and is then converged in the storage chamber; and
- converting the electrical properties of the upper electrode layer and the lower electrode layer, so as to apply the negative voltage to the upper electrode layer and the positive voltage to the lower electrode layer, the piezoelectric actuation layer then drives and controls the vibration layer to displace in a direction toward the substrate, so that the volume of the storage chamber is compressed by the vibration layer, and the fluid converged in the storage chamber flows through the outflow aperture, the outlet groove and the outflow channel sequentially and is discharged out of the micro fluid actuator from the outflow opening to achieve fluid transportation.

19. A micro fluid actuator comprising:
- at least one substrate having at least one first surface, at least one second surface, at least one outlet groove, at least one inlet groove, at least one outflow aperture, a plurality of first inflow apertures and at least one second inflow aperture, wherein the outlet groove, the inlet groove, the outflow aperture, the plurality of first inflow apertures and the second inflow aperture are formed by an etching process, the outlet groove is in fluid communication with the outflow aperture, and the inlet groove is in fluid communication with the plurality of first inflow apertures and the second inflow aperture;
- at least one chamber layer formed on the first surface of the substrate by a deposition process, and is etched to form at least one storage chamber, wherein the storage chamber is in fluid communication with the outflow aperture, the plurality of first inflow apertures and the second inflow aperture;
- at least one vibration layer formed on the chamber layer by the deposition process;
- at least one lower electrode layer formed on the vibration layer by the deposition process and the etching process;
- at least one piezoelectric actuation layer formed on the lower electrode layer by the deposition process and the etching process;
- at least one upper electrode layer formed on the piezoelectric actuation layer by the deposition process and the etching process;
- at least one orifice layer having at least one outflow opening and at least one inflow opening formed by the etching process; and
- at least one flow channel layer formed on the orifice layer by a rolling process with at least one dry film material, wherein at least one outflow channel, at least one inflow channel and a plurality of columnar structures are formed by a lithography process, wherein the flow channel layer is mounted onto the second surface of the substrate by a flip-chip alignment process and a hot-pressing process, wherein the outflow opening of the orifice layer is in fluid communication with the outlet groove of the substrate through the outflow channel, and wherein the inflow opening of the orifice layer is in fluid communication with the inlet groove of the substrate through the inflow channel;
- wherein driving power which have different phases are provided to the upper electrode layer and the lower electrode layer, so as to drive and control the vibration layer to displace in a reciprocating manner, so that fluid is inhaled through the inflow opening, flows into the storage chamber through the plurality of first inflow apertures and the second inflow aperture, is compressed to flow through the outflow aperture and is then discharged out from the outflow opening to achieve fluid transportation.

* * * * *